(12) United States Patent
Zachan et al.

(10) Patent No.: US 7,138,839 B2
(45) Date of Patent: Nov. 21, 2006

(54) PHASE-LOCKED LOOPS

(75) Inventors: Jeffrey M. Zachan, Aliso Viejo, CA (US); Geoff Hatcher, Newport Beach, CA (US); Edward Youssoufian, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 43 days.

(21) Appl. No.: 10/849,266

(22) Filed: May 19, 2004

(65) Prior Publication Data

US 2005/0258907 A1     Nov. 24, 2005

(51) Int. Cl.
*H03L 7/06* (2006.01)

(52) U.S. Cl. .................................... 327/157; 331/16

(58) Field of Classification Search .............. None
See application file for complete search history.

(56) References Cited

U.S. PATENT DOCUMENTS

| | | | | |
|---|---|---|---|---|
| 5,831,483 | A * | 11/1998 | Fukuda | 331/17 |
| 6,147,561 | A * | 11/2000 | Rhee et al. | 331/12 |
| 6,448,755 | B1 * | 9/2002 | Opsahl | 324/76.53 |
| 6,483,391 | B1 | 11/2002 | Magoon et al. | 331/183 |
| 6,624,707 | B1 * | 9/2003 | Davis et al. | 331/25 |
| 6,903,586 | B1 * | 6/2005 | Abbasi et al. | 327/158 |
| 6,906,565 | B1 * | 6/2005 | Keaveney | 327/147 |

* cited by examiner

*Primary Examiner*—Timothy P. Callahan
*Assistant Examiner*—Cassandra Cox
(74) *Attorney, Agent, or Firm*—Thomas, Kayden, Horstemeyer & Risley, LLP (57) ABSTRACT

A phase-locked loop (PLL) is disclosed. One embodiment, among others, includes a PLL that provides a control current and varies the control current in proportion to an inverse of N squared. N is the ratio of the output frequency of the PLL system to the reference frequency of the PLL system. The varying of the control current compensates for bandwidth changes of the PLL system.

18 Claims, 9 Drawing Sheets

| 502 | 504 | 506 | 508 | 510 |
|---|---|---|---|---|
| $b_1$ | $b_0$ | $C_{bin}$ | $C_{var,0.3}$ | $C_{var,2.2}$ |
| 0 | 0 | 0 | $C_{0.3}$ | $C_{2.2}$ |
| 0 | 1 | $C$ | $C_{0.3}$ | $C_{2.2}$ |
| 1 | 0 | $2C$ | $C_{0.3}$ | $C_{2.2}$ |
| 1 | 1 | $3C$ | $C_{0.3}$ | $C_{2.2}$ |

| $C_{var,0.3}$ | $C_{bin\,var,0.3}$ | $C_{var,2.2}$ | $C_{bin\,var,2.2}$ |
|---|---|---|---|
| $C_{0.3}$ | $C_{0.3}$ | $C_{2.2}$ | $C_{2.2}$ |
| $C_{0.3}$ | $C_{0.3}$ | $C_{2.2}$ | $C_{2.2}$ |
| $C_{0.3}$ | $2C_{0.3}$ | $C_{2.2}$ | $2C_{2.2}$ |
| $C_{0.3}$ | $3C_{0.3}$ | $C_{0.3}$ | $3C_{2.2}$ |

PHASE-LOCKED LOOPS

BACKGROUND OF THE INVENTION

1. Field of the Invention

This invention is generally related to frequency synthesizers. More particularly, the invention relates to providing predictable oscillator sensitivity and/or substantially constant loop bandwidth in phase-locked loops.

2. Related Art

Frequency synthesizers are regularly employed in communication transceivers used in numerous types of communication systems and technologies. The frequency synthesizer typically includes a phase-locked loop (PLL) comprising an oscillator such as a voltage-controlled oscillator (VCO), a low-pass filter, and a phase and/or frequency detector. The phase and/or frequency detector controls the frequency of the output signal of the VCO. A phase and/or frequency detector in the PLL receives the output signal and compares the output signal to a reference frequency. Based on the comparison of the output signal to the reference frequency, the phase and/or frequency detector generates a control signal that is provided to the low-pass filter and then to the VCO. The control signal is typically received by a variable capacitor, sometimes referred to as a varactor, in the VCO. The control signal tunes the variable capacitor, thereby changing the frequency of the output signal of the VCO.

Wide-tuning VCO's can exhibit a sensitivity that is voltage and/or frequency dependent. $K_v$ is a measure of the sensitivity of a VCO, and can be described algebraically as follows:

$$K_V = \frac{\partial f_{VCO}}{\partial V_{control}} \quad \text{(Eq. 1)}$$

where $f_{VCO}$ is the VCO output frequency and $V_{control}$ is the VCO control voltage. PLLs often use off-chip components for the loop filter. With the industry moving towards higher integration/systems on a chip, integrating the loop filter is one of the primary challenges to implementing systems on a chip. In PLLs that require fast settling times, a frequency dependent $K_v$ can make loop filter design a difficult task, especially when integrating the filter on a semiconductor chip.

In addition, for wide-band oscillators, there is a large variation in loop bandwidth, and PLL settling times and noise performance can severely deteriorate.

Therefore it would be desirable to provide a PLL with a constant or substantially constant bandwidth and/or a predictable $K_v$.

SUMMARY

Preferred embodiments of the invention include a phase-locked loop (PLL). One embodiment of the invention, among others, includes a PLL that provides a control current and varies the control current in proportion to the inverse of N squared. N is defined as the ratio of the output frequency of the PLL to the reference frequency of the PLL. The varying of the control current compensates bandwidth changes of the PLL arising from frequency dependence of $K_v$.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The phase-locked loop can be better understood with reference to the following figures. The components within the figures are not necessarily to scale, emphasis instead being placed upon clearly illustrating the principles of the phase-locked loop. Moreover, in the figures, like reference numerals designate corresponding parts throughout the different views.

DETAILED DESCRIPTION

Preferred embodiments of a phase-locked loop (PLL) having substantially constant bandwidth and/or predictable $K_v$ are disclosed. Although described with particular reference to a portable transceiver, the PLL can be implemented in substantially any system that provides frequency control for a synthesizer. Further, although the PLL is described in the context of an apparatus having a hybrid voltage-controlled oscillator (VCO), other devices or systems can similarly benefit and are considered within the scope of the invention. A hybrid VCO includes a VCO that operates under coarse and fine-tuning control, as explained below.

Figure 1:
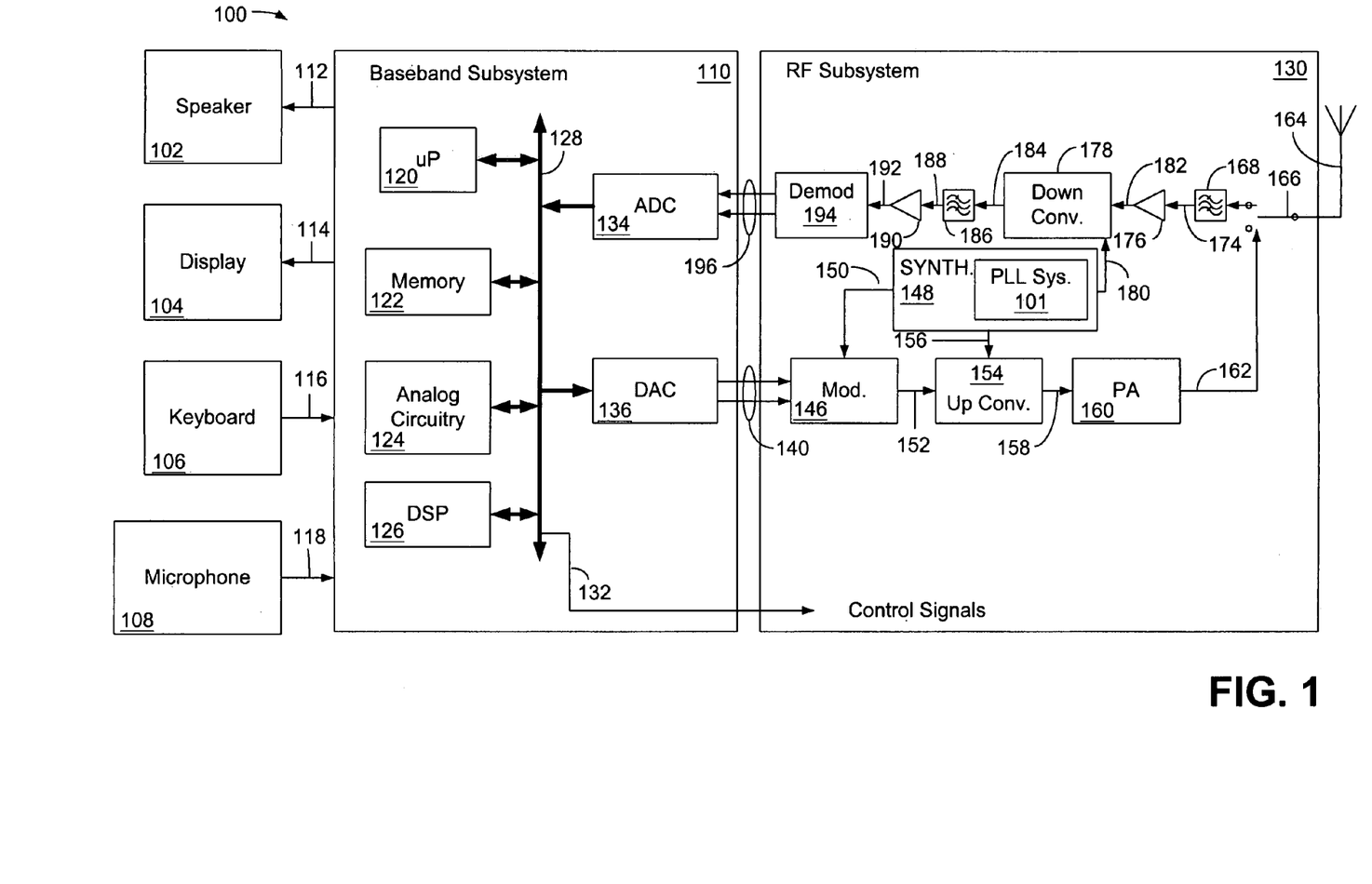
FIG. 1 is a block diagram illustrating a simplified portable transceiver.

FIG. 1 is a block diagram illustrating a simplified portable transceiver 100 that illustrates an example implementation for the PLL, according to an embodiment of the invention. The portable transceiver 100 includes a speaker 102, display 104, keyboard 106, and microphone 108, all connected to a baseband subsystem 110. In a particular embodiment, the portable transceiver 100 can be, for example but not limited to, a portable telecommunication device such as a mobile/cellular-type device. The speaker 102 and display 104 receive signals from the baseband subsystem 110 via connections 112 and 114, respectively, as known to those skilled in the art. Similarly, the keyboard 106 and microphone 108 supply signals to the baseband subsystem 110 via connections 116 and 118, respectively.

The baseband subsystem 110 includes a microprocessor (μP) 120, memory 122, analog circuitry 124, and a digital signal processor (DSP) 126 in communication via a bus 128. The bus 128, although shown as a single bus, may be implemented using multiple busses connected as necessary among the subsystems within the baseband subsystem 110. The microprocessor 120 and memory 122 provide the signal timing, processing and storage functions for the portable transceiver 100. The analog circuitry 124 provides the analog processing functions for the signals within the baseband subsystem 110. The baseband subsystem 110 provides control signals to a radio frequency (RF) subsystem 130 via connection 132. Although shown as a single connection 132, the control signals may originate from the DSP 126 or from the microprocessor 120, and may be supplied to a variety of points within the RF subsystem 130. It should be noted that, for simplicity, only the basic components of the portable transceiver 100 are illustrated herein.

The baseband subsystem 110 also includes an analog-to-digital converter (ADC) 134 and a digital-to-analog converter (DAC) 136. The ADC 134 and DAC 136 also communicate with the microprocessor 120, memory 122, analog circuitry 124 and the DSP 126 via the bus 128. The DAC 136 converts the digital communication information within the baseband subsystem 110 into an analog signal for transmission to RF subsystem 130 via connection 140. Connection 140, shown as two directed arrows, includes the information that is to be transmitted by the RF subsystem 130 after conversion from the digital domain to the analog domain.

The RF subsystem 130 includes a modulator 146, which, after receiving a frequency reference signal (also called a "local oscillator" signal, or "LO") from the synthesizer 148 via connection 150, modulates the received analog information and provides a modulated signal via connection 152 to an upconverter 154. In a constant envelope modulation methodology, the modulated transmit signal generally includes only phase information. The upconverter 154 also receives a frequency reference signal from the synthesizer 148 via connection 156. The synthesizer 148 determines the appropriate frequency to which the upconverter 154 upconverts the modulated signal on connection 152.

The synthesizer 148 often includes a phase-locked loop (PLL) 101. The synthesizer 148 uses the PLL 101 to precisely control the frequency of the output signal of an oscillator (not shown), such as a voltage-controlled oscillator (VCO) disposed in the synthesizer 148. The synthesizer 148 includes components that provide fine and coarse tuning of the VCO, as explained below.

The upconverter 154 supplies the modulated signal via connection 158 to a power amplifier 160. The power amplifier 160 amplifies the modulated signal on connection 158 to the appropriate power level for transmission via connection 162 to antenna 164. Illustratively, a switch 166 controls whether the amplified signal on connection 162 is transferred to antenna 164 or whether a received signal from antenna 164 is supplied to a receive filter 168. The operation of the switch 166 is controlled by a control signal from the baseband subsystem 110 via connection 132. Alternatively, the switch 166 may be replaced by a filter pair (e.g., a duplexer) that allows simultaneous passage of both transmit signals and receive signals, as known in the art.

A signal received by the antenna 164 will be directed to the receive filter 168. The receive filter 168 will filter the received signal and supply the filtered signal on connection 174 to a low-noise amplifier (LNA) 176. The receive filter 168 is a band pass filter, which passes all channels of the particular cellular system in which the portable transceiver 100 is operating. As an example, for a 900 MHz (mega-Hertz) GSM (Global System for Mobile Communication) system, the receive filter 168 would pass all frequencies from 925 MHz to 960 MHz, covering all 175 contiguous channels of 200 kHz (kilo-Hertz) each. One purpose of this filter 168 is to reject all frequencies outside the desired region. The LNA 176 amplifies the weak signal on connection 174 to a level at which downconverter 178 can translate the signal from the transmitted frequency to an intermediate frequency (IF). Alternatively, the functionality of the LNA 176 and the downconverter 178 can be accomplished using other elements, such as, for example but not limited to, a low-noise block downconverter (LNB).

The downconverter 178 receives a frequency reference signal (also called a "local oscillator" signal, or "LO") from the synthesizer 148, via connection 180, which signal instructs the downconverter 178 as to the proper frequency to which to downconvert the signal received from the LNA 176 via connection 182. The downconverted frequency is called the intermediate frequency or IF. The downconverter 178 sends the downconverted signal via connection 184 to a channel filter 186, also called an "IF filter." The channel filter 186 filters the downconverted signal and supplies it via connection 188 to an amplifier 190. The channel filter 186 selects the one desired channel and rejects all others. Using the GSM system as an example, only one of the 175 contiguous channels is actually to be received. After all channels are passed by the receive filter 168 and downconverted in frequency by the downconverter 178, only the one desired channel will appear precisely at the center frequency of the channel filter 186.

The synthesizer 148, by controlling the local oscillator frequency supplied on connection 180 to the downconverter 178, determines the selected channel. The amplifier 190 amplifies the received signal and supplies the amplified signal via connection 192 to a demodulator 194. The demodulator 194 recovers the transmitted analog information and supplies a signal representing this information via connection 196 to the ADC 134. The ADC 134 converts these analog signals to a digital signal at baseband frequency and transfers the signal via the bus 128 to the DSP 126 for further processing. As an alternative, the downconverted carrier frequency (IF frequency) at connection 184 may be 0 Hz, in which case the receiver is referred to as a "direct conversion receiver." In such a case, the channel filter 186 is implemented as a low-pass filter, and the demodulator 194 may be omitted.

Figure 2:
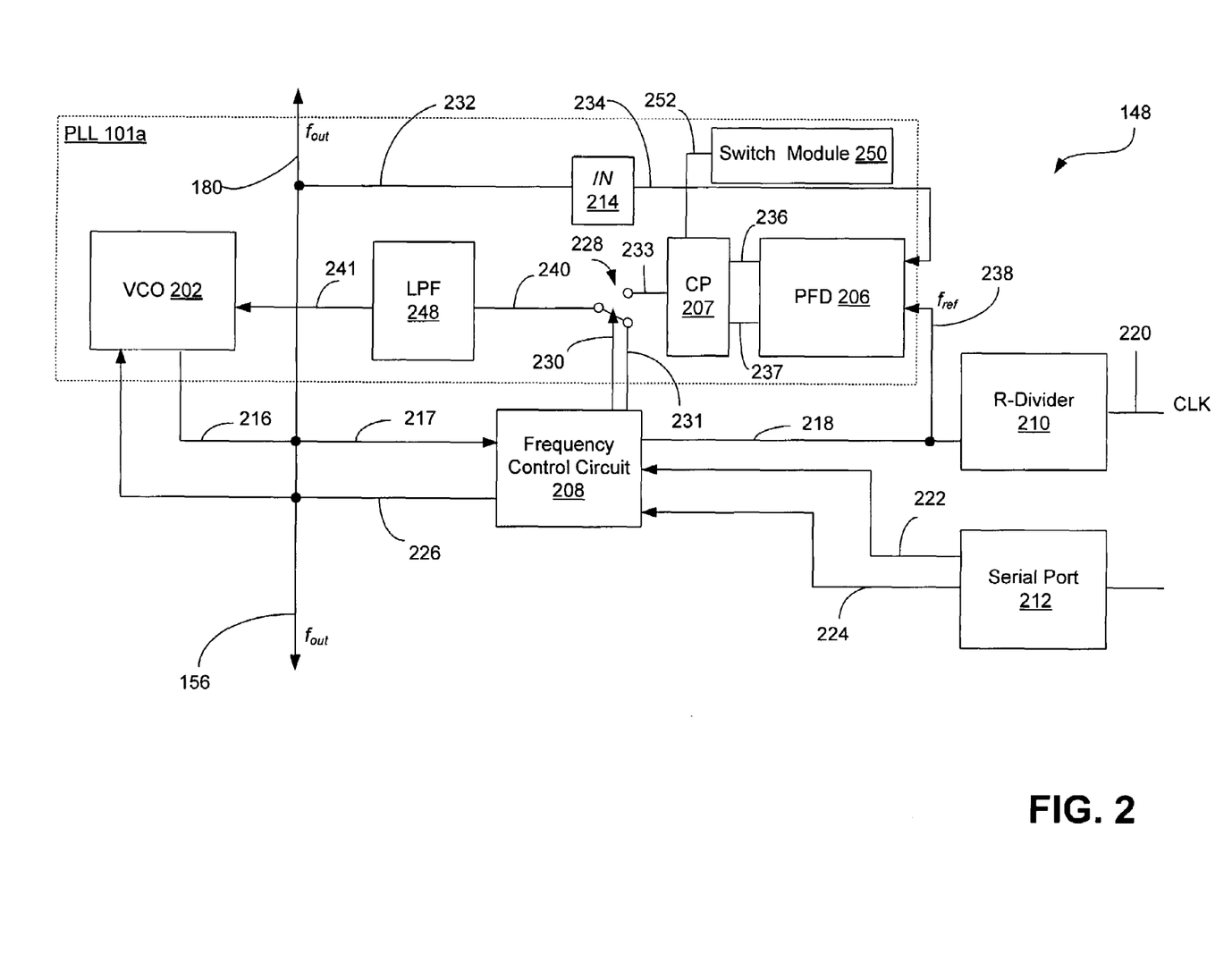
FIG. 2 is a block diagram illustrating one embodiment of the synthesizer shown in the portable transceiver of FIG. 1.

FIG. 2 illustrates a block diagram of one embodiment of the synthesizer 148 shown in FIG. 1. The frequency synthesizer 148 may comprise a PLL 101a, a frequency control circuit 208, an R-divider circuit 210, and a serial port 212. The PLL 101a may include a phase-frequency detector (PFD) 206, a charge pump 207, a switch module 250 that operates in conjunction with the charge pump 207, a low-pass filter (LPF) 248, a controllable oscillator such as a voltage-controlled oscillator (VCO) 202, and a divide-by-N module 214, where N can be a fractional or an integer number. In alternative embodiments, the controllable oscillator may be any type of oscillator and need not be voltage controlled, and/or the charge pump 207/PFD 206 combination can be substituted with a phase-detector or a frequency-detector, as would be understood by one having ordinary skill in the art. Additionally, although the charge pump 207 is shown as a single-path charge pump (e.g., having a single-output), a dual-path charge pump would be understood by those having ordinary skill in the art in the context of this disclosure as being within the scope of the invention.

The VCO 202 is configured to have a plurality of operational states in which each of the operational states corresponds to a distinct frequency for the output signal of the VCO 202. The VCO 202 is responsive to control signals received from the PFD 206 and the frequency control circuit 208. Note that reference to "control by the PFD 206" also includes cooperating elements of the PLL 101a, including the charge pump 207 and the switch module 250.

In the operation of the frequency synthesizer 148, the VCO 202 generates an output signal on connection 216. The output signal of the VCO 202 may be provided to the downconverter 178 (FIG. 1) via connection 180 and to the upconverter 154 (FIG. 1) via connection 156. The frequency of the output signal of the VCO 202 may be controlled by the frequency control circuit 208 and the PFD 206. In certain embodiments of the frequency synthesizer 148, the frequency of the output signal of the VCO 202 is controlled first by the frequency control circuit 208 and then by the PFD 206.

As described above, the VCO 202 may be configured to have a plurality of operational states in which each of the operational states corresponds to a distinct frequency for the output signal of the VCO 202. A coarse tuning of the output signal of the VCO 202 may be accomplished by changing the operational state of the VCO 202 and thereby changing the corresponding discrete frequency for the output signal.

Operation in one embodiment of the frequency synthesizer 148 can be described as follows. The frequency control circuit 208 receives information associated with a predefined frequency for the output signal of the VCO 202. The information associated with the predefined frequency may be received as a signal provided via the serial port 212. The R-divider circuit 210 generates the system timing based on a system clock signal received on connection 220. The input for the R-divider circuit 210 on connection 220 comes from a crystal oscillator (not shown). The crystal oscillator may be either a stand-alone part or integrated on the synthesizer chip. The crystal oscillator can be controlled by a control signal on the digital baseband control line 132 (FIG. 1). Also, in one embodiment, the data from the serial port 212 could possibly come from the control line 132, and it is the serial port 212 that ultimately controls the VCO output frequency. The frequency control circuit 208 receives information associated with the predefined frequency from the serial port 212 on connections 222 and 224.

The frequency control circuit 208 determines which of the plurality of discrete frequencies associated with the plurality of operational states of the VCO 202 best approximates the predefined frequency. The frequency control circuit 208 receives the output signal of the VCO 202 on connections 216 and 217. The frequency control circuit 208 generates a control signal configured to change the frequency of the output signal of the VCO 202 to the operational state corresponding to the discrete frequency that best approximates the predefined frequency. The frequency control circuit 208 may provide the control signal to the VCO 202 on connection 226. In response to the control signal from frequency control circuit 208, the VCO 202 may be changed to the operational state corresponding to the discrete frequency that best approximates the predefined frequency.

In one embodiment, after the frequency of the output signal of the VCO 202 has been changed to the operational state corresponding to the discrete frequency that best approximates the predefined frequency, the frequency of the output signal of the VCO 202 may be further controlled by the PFD 206. In this manner, the frequency control circuit 208 may perform a less accurate approximation (coarse tuning) of the predefined frequency, but one which is much faster, for example, than the PFD 206 can provide, over a wider range of frequencies. Then, the PFD 206 may be used to perform a much more precise approximation (fine-tuning) of the predefined frequency.

The frequency control circuit 208 may enable the PFD 206 to begin controlling the frequency of the output signal of the VCO 202 by, for example, engaging switch 228 in response to a switch control signal supplied on connection 230. The switch 228 and the switch control signal may be configured so that when the PFD 206 is to control the VCO 202, the switch 228 connects connection 233 and connection 240, and when the frequency control circuit 208 is to control the VCO 202, the switch 228 connects connection 240 and connection 231. Furthermore, when the frequency control circuit 208 is engaged, a control signal may be provided on connection 231. The control signal on connection 231 may be configured to disengage the controlling mechanism within the VCO 202 that is engaged by the PFD 206 while controlling the frequency of the VCO 202. For example, where the VCO 202 is voltage-controlled by the PFD 206 through a variable capacitor, the frequency control circuit 208 may be configured to provide a constant voltage on connection 231 in order keep the variable capacitor set to a constant value while the frequency control circuit 208 is engaged.

When engaged by the frequency control circuit 208, the PFD 206 may control the frequency of the output signal of the VCO 202 in a fine-tuning manner. For example, the PFD 206 receives the output signal of the VCO 202 on connection 232 and 234 (and divided through the divide-by-N module 214) and the reference frequency on connection 238. Based on the output signal from the VCO 202 and the reference frequency, the PFD 206 generates control signals (comprising phase/frequency information) and provides the control signals to the charge pump 207 via connections 236 and 237. The output current of the charge pump 207 is also controlled by the switch module 250 via connection 252. The switch module 250 provides control signals to the charge pump 207 to open and close one or more switches (not shown), thus turning on and off one or more current sources (not shown) of the charge pump 207 in a manner that enables a constant or substantially constant PLL bandwidth as explained below.

The signal from the charge pump 207 is provided over connection 233 and 240 to the low-pass filter 248. The filtered signal is provided on connection 241 to the VCO 202. In response to the signal on connection 241, a variable capacitor (not shown in FIG. 2) in the VCO 202 may be engaged. The control signal and the variable capacitor may be configured to control the frequency of the output signal of the VCO 202 on connection 216.

It should be understood that there are numerous embodiments for the frequency synthesizer 148. For example, the frequency of the output signal of the VCO 202 may be controlled first by the frequency control circuit 208 and then by the PLL 101a. However, in other embodiments of the frequency synthesizer 148, the frequency of the output signal of the VCO 202 may be controlled in other ways.

Figure 3A:
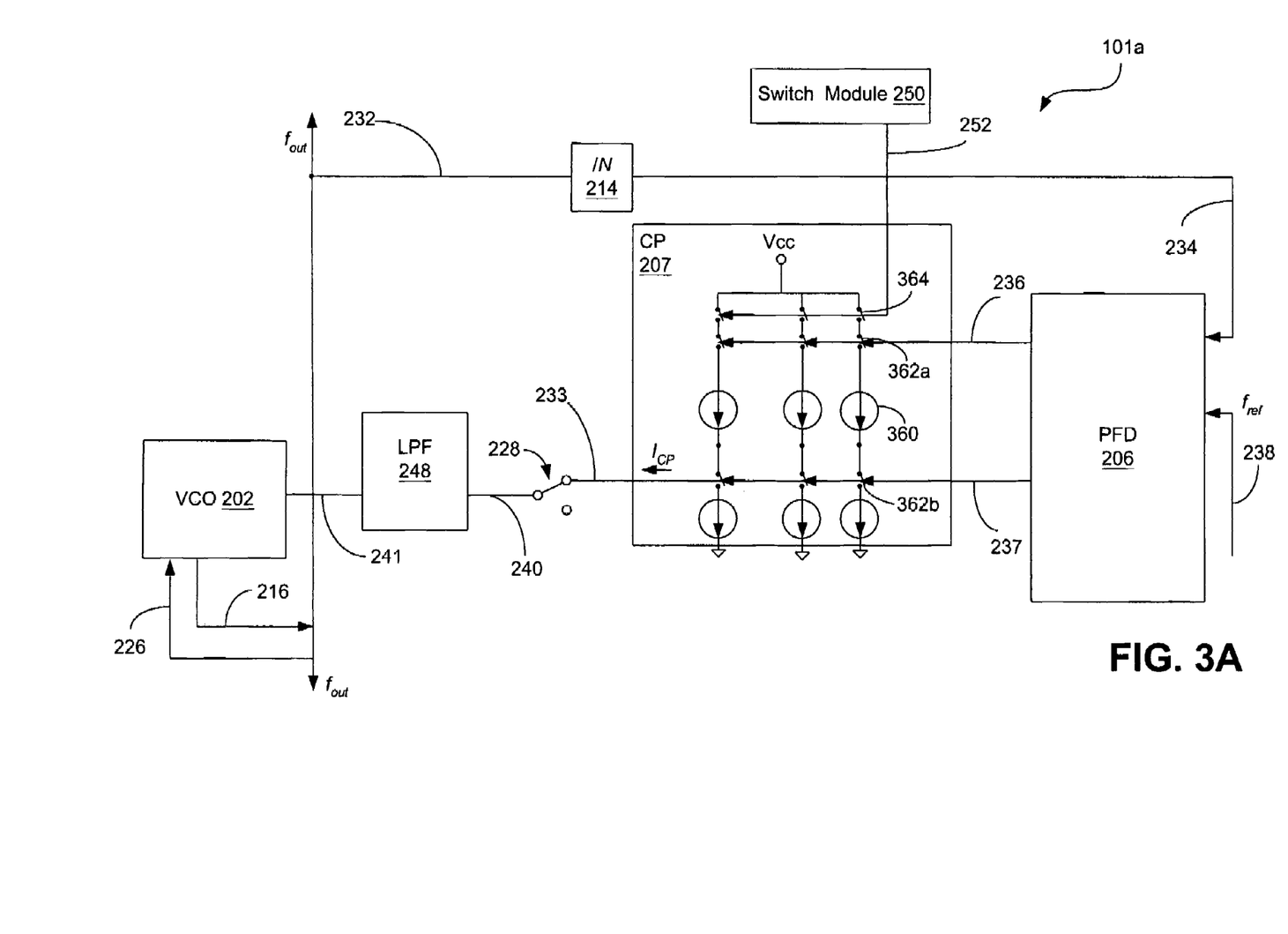
FIG. 3A is a block diagram of one embodiment of the phase-locked loop (PLL) shown in the synthesizer of FIG. 2.

FIG. 3A is a block diagram illustrating a more detailed view of select components of the PLL 101a of FIG. 2. As shown, the PLL 101a includes the PFD 206, the charge pump 207, the LPF 248, the VCO 202, the divide-by-N module 214, and the switch module 250. The PFD 206 receives a reference frequency ($f_{ref}$) on connection 238, and a feedback signal derived from the VCO 202 on connection 234. The PFD 206 performs a comparison of these two signals. The PFD 206 provides pulses at either connection 236 or 237 with a pulse width equal to the phase difference between the inputs at connections 234 and 238. Thus, the signal output at connections 236 and 237 provide an indication of the frequency/phase difference between the signals at connections 234 and 238.

The charge pump 207 receives the signals on connections 236 and 237. The signals are used to actuate switches 362a, 362b, which in turn enables current flow via current sources 360 from Vcc to LPF 248. The switching module 250 can be comprised of digital logic. The switching module 250 provides a control signal or signals to one or more switches 364 of the charge pump 207 according to mechanisms described below. The switching module 250, in some embodiments, can be disposed in the charge pump 207. The charge pump 207 responsively provides a control signal (e.g., charge pump current, $I_{CP}$) over connection 233 (and 240 via switch 228) to LPF 248 and then to VCO 202 over connection 241 to provide for frequency tuning of the VCO 202. The VCO 202 implements a corrected phase/frequency signal per the control signal on connection 241, and provides the corrected signal over connection 232 to the divide-by-N module 214. The corrected signal is divided down at the divide-by-N module 214, and then provided back to the PFD 206 via connection 234. The divide-by-N module 214 specifies $f_{out}/f_{ref}$ (i.e., $N=f_{out}/f_{ref}$), as indicated above.

The bandwidth of the PLL 101a is proportional to the charge pump current, $I_{CP}$. Below it will be shown that if the charge pump current is inversely proportional to $N^2$, the overall loop bandwidth will be constant or substantially constant. In one embodiment, the PLL frequency word, N (where $N=f_{out}/f_{ref}$) is programmed into the PLL 101a (e.g., the switch module 250), and the switch module 250 uses N to control the charge pump current, $I_{CP}$.

The $K_v$ of a LC oscillator has a dependence on $N^3$, where N is a ratio of the output frequency ($f_{out}$) of the PLL 101a to its reference frequency, $f_{ref}$ as indicated above. This is now demonstrated. For a typical LC oscillator, $f_{out}$ is proportional to the term, $$f_{out} \alpha \frac{1}{\sqrt{L \times (C_0 + C_{var}(V))}}, \quad \text{(Eq. 2)}$$

where L is the inductance in the oscillator tank, $C_0$ is a fixed (i.e. not dependant on the control voltage) capacitance, and $C_{var}(V)$ is some variable capacitance. Then, using the definition for $K_v$ given above (see Eq. 1), the following derivation can be made, $$\frac{\partial \omega}{\partial V} = \frac{-1}{2\sqrt{L}(C_0 + C(V))^{\frac{3}{2}}} \frac{\partial C(V)}{\partial V} \quad \text{(Eq. 3)}$$

$$f_{osc} = \frac{1}{\sqrt{L[C_0 + C(V)]}} = N \cdot f_{ref} \Rightarrow C_0 = C(V) = \frac{1}{L \cdot (N \cdot f_{ref})^2} \quad \text{(Eq. 4)}$$

$$\frac{\partial \omega}{\partial V} = -\frac{1}{2} L \cdot (N \cdot f_{ref})^3 \cdot \frac{\partial C(V)}{\partial V} = -N^3 \cdot f(V) \quad \text{(Eq. 5)}$$

Thus it is seen that $K_v$ changes with $N^3$ in a LC oscillator. The loop bandwidth for a typical PLL configured with a PFD/charge pump is also known to be proportional to the term, $$\text{Loop bandwidth} \alpha \frac{K_v I_{CP}}{N}. \quad \text{(Eq. 6)}$$

Since $K_v$ is proportional to $N^3$, the overall term is proportional to $I_{CP} \times N^2$. Thus, the PLL charge pump current, $I_{CP}$, compensates for loop bandwidth changes due to $K_v$ variations with N when it changes as a function of $1/N^2$. In the PLL 101a, this variation of $1/N^2$ is maintained by the switch module 250 changing the charge pump current $I_{CP}$ via switching on and off the switches 364. For example, various values of N are provided to the switching module 250 (e.g., via connection 132 (FIG. 1)). A look-up-table or similar mechanism can be employed by the switching module 250 that equates the inputted value of N to one or more current sources 360 of the charge pump 207. In other words, varying quantities of current sources 360 can be implemented depending on the inputted value of N.

Figure 3B:
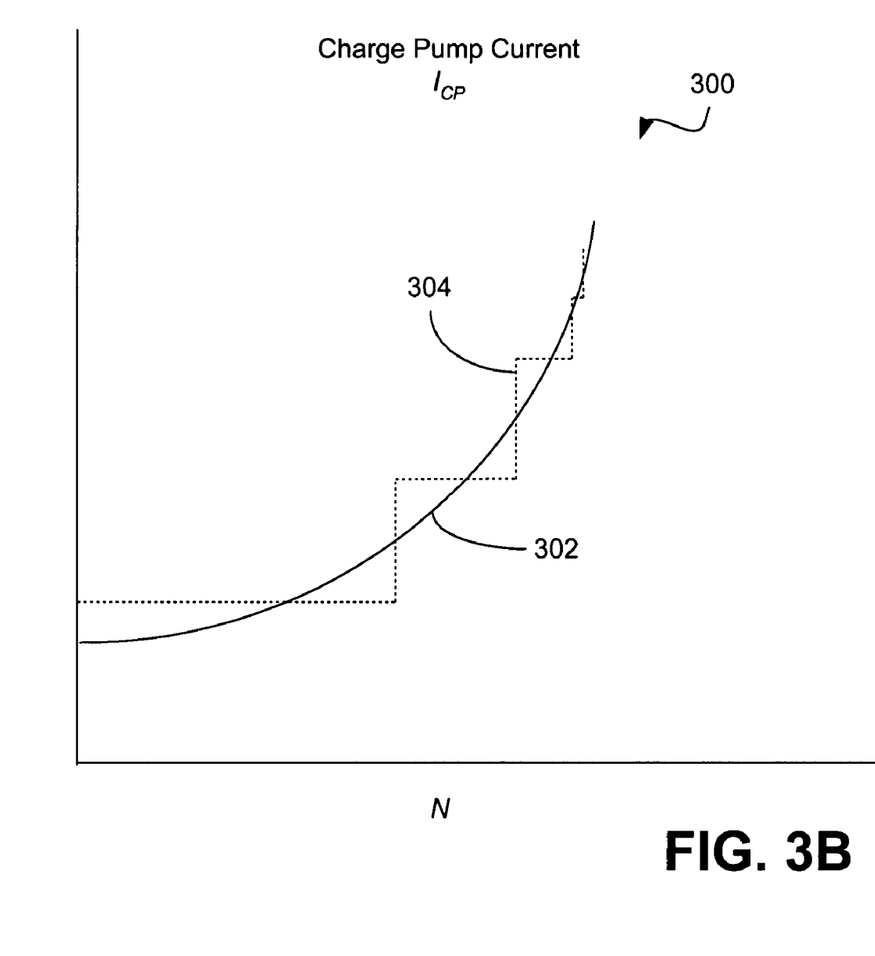
FIG. 3B is a graph illustrating incremental current increases as a function of threshold range changes of N as implemented in the PLL of FIG. 3A.

Ideally, the charge pump current $I_{CP}$ varies as a function of $1/N^2$. Practically, thresholds can be implemented. For example, given a defined range of values corresponding to N, one or more current sources 360 are implemented. FIG. 3B is a graph 300 illustrating the incremental variations in $I_{CP}$ per threshold range of N. The solid line 302 represents a continual variation in $I_{CP}$ for change in N. That is, for every change in N, there is a continuous change in current. The dashed line 304 represents a step-wise variation in $I_{CP}$ for a threshold range of N.

Note that in other embodiments, a phase detector or frequency detector may be implemented instead of the PFD 206 and charge pump 207 (FIG. 3A), as would be understood in the context of this disclosure by one having ordinary skill in the art. For example, in a mixer, the voltage gain of the mixer can be varied. In such embodiments, the gain is varied using similar digital logic as a function of threshold ranges of N, as would be understood in light of the specification by those having ordinary skill in the art.

Figure 4A:
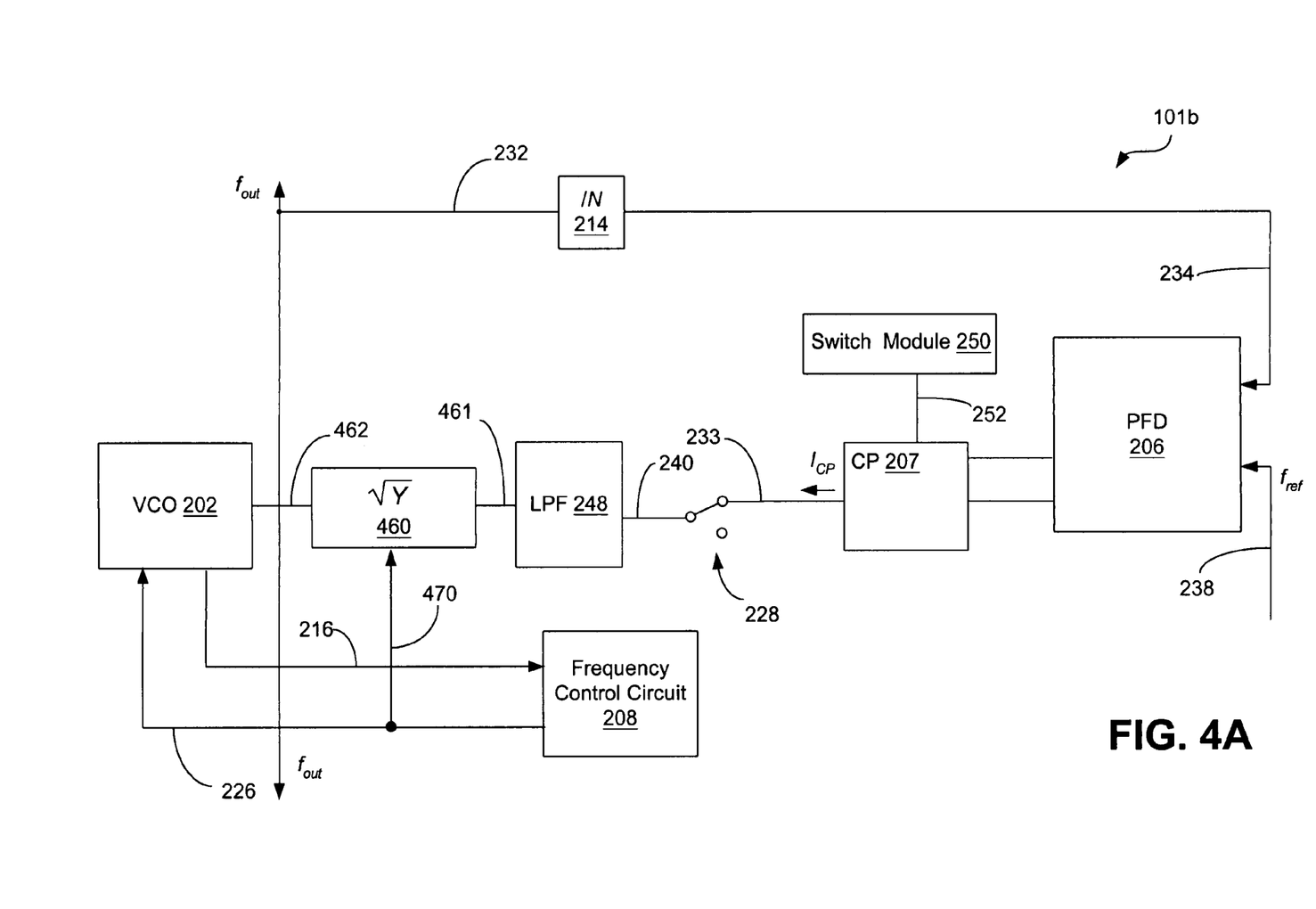
FIG. 4A is a block diagram illustrating a second embodiment of the PLL shown in the synthesizer of FIG. 2.

FIG. 4A is a block diagram of another embodiment for an exemplary PLL 101b. As shown, the PLL 101b includes components of PLL 101a (FIG. 3A), including the PFD 206, charge pump 207, LPF 248, VCO 202, divide-by-N module 214, and the switch module 250. These components were described in association with FIG. 3A, and thus further discussion of the functionality and interaction among each other will be omitted for brevity. Note that in other embodiments, one or more of these components can be omitted and/or replaced, such as replacing the PFD 206 and charge pump 207 with a phase detector or omitting or integrating the switch module 250. The PLL 101b additionally includes a square-root-Y module 460 that receives a signal from the LPF 248 over connection 461 and outputs a signal over connection 462 to the VCO 202. Before describing the operation of the PLL 101b, discussion of the internal configuration and functionality for the VCO 202 will now be described in association with FIGS. 4A and 4B.

Figure 4B:
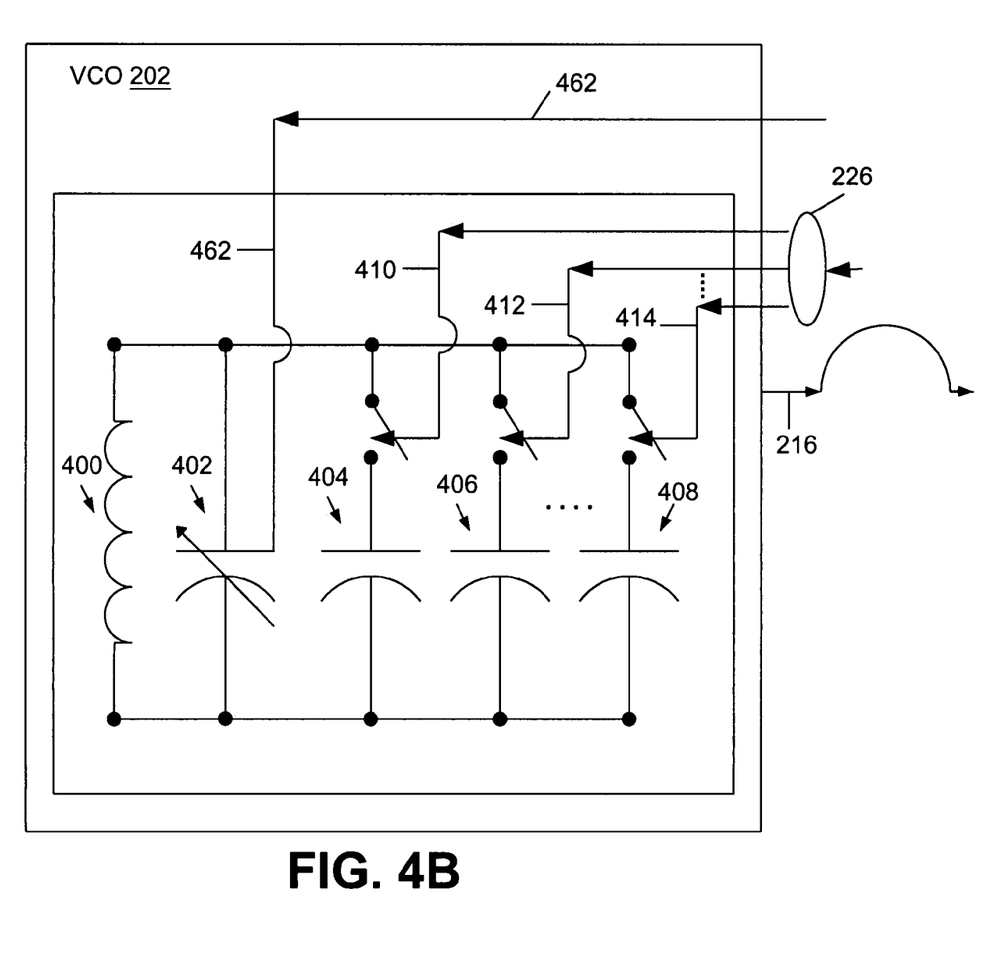
FIG. 4B is a schematic diagram illustrating the internal components of the voltage-controlled oscillator (VCO) shown in the PLL of FIG. 4A.

FIG. 4B is a schematic diagram of the VCO 202. The VCO 202 may comprise an inductor 400, a variable capacitor 402, and switched capacitors 404, 406, and 408. The inductor 400, variable capacitor 402, and switched capacitors 404, 406, and 408 may be connected in parallel. However, as known by one of ordinary skill in the art, there are various other configurations for the inductor 400, variable capacitor 402, and switched capacitors 404, 406, and 408. For example, the inductor 400, variable capacitor 402, and switched capacitors 404, 406, and 408 may be connected in series or may be connected in any of a number of combinations of parallel and series connections. Furthermore, one of ordinary skill in the art should also know that there are numerous other ways of configuring the VCO 202 in order to implement the plurality of operational states. As indicated above, the VCO 202 is configured to have a plurality of operational states in which each of the operational states correspond to a distinct frequency for the output signal of the VCO 202 and that the operational state of the VCO 202 is responsive to control signals received from the PFD 206 and the frequency control circuit 208.

The switched capacitors 404, 406, and 408 receive the control signal from the frequency control circuit 208 on connection 226. In response to the control signal from frequency control circuit 208, switched capacitors 404, 406, and 408 are engaged or disengaged in a manner corresponding to one of the operational states. In one of numerous embodiments of the frequency synthesizer 148 (FIG. 1), the number of switched capacitors defines the number of operational states and corresponding frequencies for the output signal of the VCO 202. For instance, if there are three switched capacitors, the VCO 202 may have eight ($2^3=8$) operational states. Because each of the switched capacitors may be engaged or disengaged, there are eight possible binary configurations for the switched capacitors, with each configuration producing a distinct frequency for the output signal of the VCO 202. As shown in Equations 5 and 6, each distinct frequency for the output signal of the VCO 202 may be defined as a function of the component values for the inductor 400 (L), variable capacitor 402 ($C_{var}$), and switched capacitors 404 ($C_0$), 406 ($C_1$), and 408 ($C_n$) and binary weighting coefficients $b_0$, $b_1$, and $b_n$, where $f_{out}$ is the frequency of the output signal of the VCO 202:

$$f_{out} \alpha \frac{1}{\sqrt{LC}} \quad \text{(Eq. 7)}$$

$$C = C_{var} + C_{static} + b_0 C_0 + b_1 C_1 + \ldots b_n C_n \quad \text{(Eq. 8)}$$

Here, $C_{static}$ is a non-switchable, non-voltage dependant capacitance that may be parasitic or intentional. In Equation 7, the switched capacitors 404, 406, and 408 may be binary weighted. For example, in a 3-bit digital system, the switched capacitors 404, 406, and 408 may be weighted as follows: $C_0 = C$, $C_1 = 2C$, and $C_3 = 8C$.

The number of switched capacitors also relates to the minimum number of control lines required between the frequency control circuit 208 and the VCO 202. For example, if there are three switched capacitors to be engaged or disengaged, the frequency control circuit 208 generally uses at least three control lines (one control line for each switched capacitor). For example, the frequency control circuit 208 may determine that for a 3-bit system the frequency of the output signal of the VCO 202 best approximates the predefined frequency where the switched capacitor 404 is engaged, switched capacitor 406 is disengaged, and switched capacitor 408 is engaged. Accordingly, the frequency control circuit 208 may generate three control signals. A first control signal on connection 410 corresponding to the switched capacitor 404 may be configured to engage the switched capacitor 404. A second control signal on connection 412 corresponding to the switched capacitor 406 may be configured to disengage switched capacitor 406. A third control signal on connection 414 corresponding to the switched capacitor 408 may be configured to engage the switched capacitor 408. In response to these control signals, the switched capacitors 404, 406, and 408 are engaged, disengaged, and engaged, respectively. This configuration changes the VCO 202 to the operational state corresponding to the distinct frequency that best approximates the predefined frequency.

In those embodiments where the PFD 206 also controls the VCO 202, the VCO 202 may be further controlled by varying the control signal applied to the variable capacitor 402 on connection 462.

The VCO 202 of the PLL 101b is configured with a binary weighted variable capacitor that is placed in parallel with each binary weighted capacitor (e.g., switched capacitors 404–408) in the capacitor array. Such a configuration provides for an average $K_v$ versus frequency that is constant when the capacitance $C_{static}$ is negligible. The binary weighting is implemented by sizing the capacitive devices larger or smaller, and/or adding or removing multiple capacitive devices. For an example of the former implementation, each varactor can be twice the size of the preceding varactor in the array. In one embodiment, the square-root-Y module 460 receives digital coarse-tune information from the frequency control circuit 208 over connection 470 and uses such information to process the control signal on connection 461, thus maintaining a constant or substantially constant $K_v$ versus frequency via the control signal on connection 462. A constant, predictable $K_v$ enables the variable capacitor range to be lowered (hence the VCO gain decreases), which facilitates the integration of the loop filter (e.g., LPF 248).

To provide further insight to the methodology implemented by the PLL 101b, consider $K_v$ and assume that $C_{static}$ is negligible. The average $K_v$ (as opposed to the small signal $K_v$ described in equation 1) can be written as follows:

$$K_v = \frac{f_{max} - f_{min}}{V_{max} - V_{min}} = \frac{1}{2\pi \Delta V} \left( \frac{1}{\sqrt{LC_1}} - \frac{1}{\sqrt{LC_2}} \right). \quad \text{(Eq. 9)}$$

Since the inductance L, and control voltage $\Delta V$ are constant, $K_v$ is essentially proportional to:

$$K_v = \frac{1}{2\pi \Delta V \sqrt{L}} \left( \frac{1}{\sqrt{C_1}} - \frac{1}{\sqrt{C_2}} \right) \alpha \left( \frac{1}{\sqrt{C_1}} - \frac{1}{\sqrt{C_2}} \right), \quad \text{(Eq. 10)}$$

where $C_1$ and $C_2$ consist of the variable capacitor capacitance values for the two control voltage extremes as well as the static capacitance chosen by the digital coarse tune.

Figure 5:
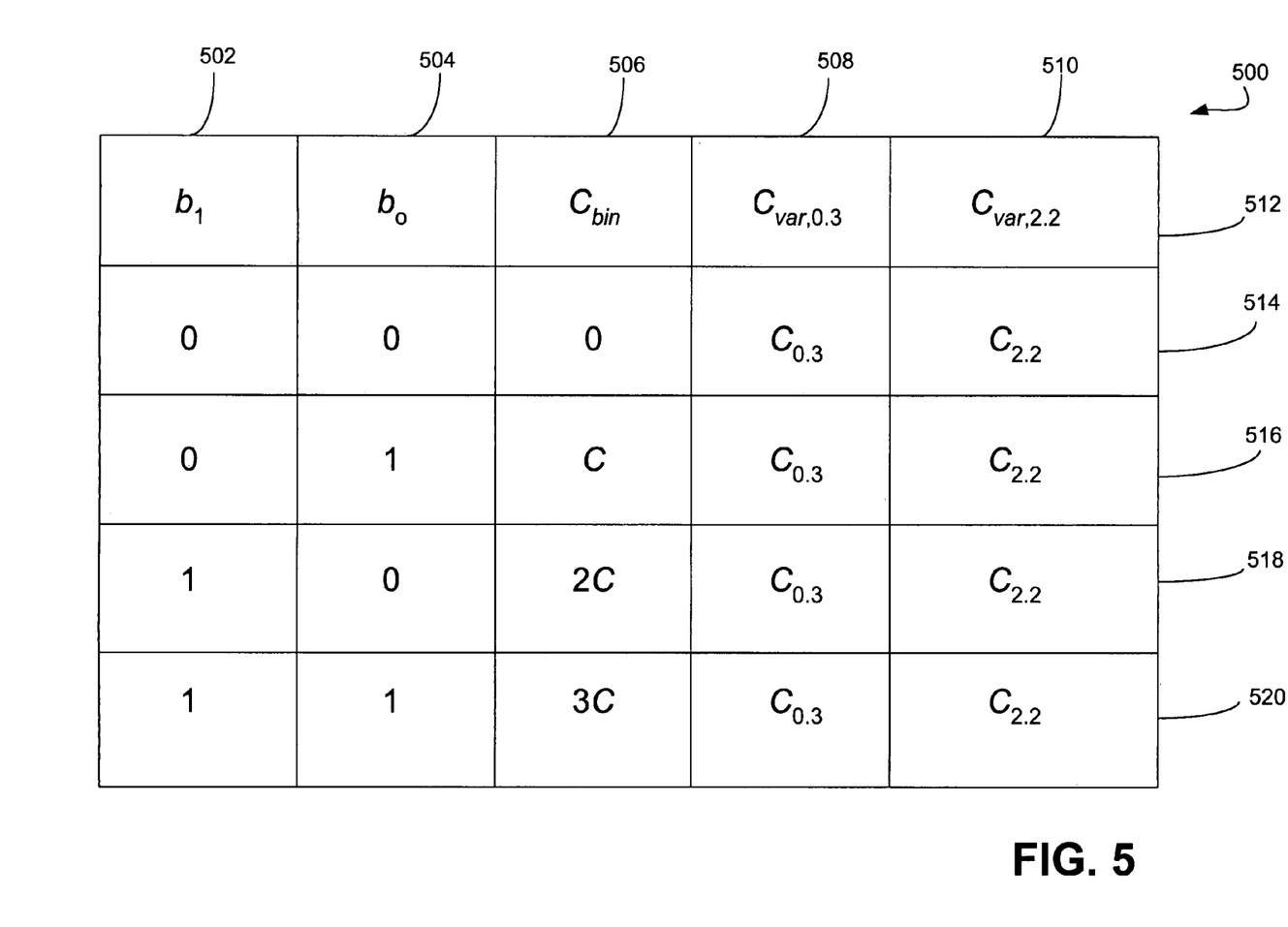
FIG. 5 is a schematic diagram illustrating a truth table for a 2-bit hybrid VCO with a binary-weighted capacitor array for one example implementation.

FIG. 5 is a schematic diagram illustrating a truth table 500 for the VCO 202 (FIG. 4B) implemented as a 2-bit hybrid VCO with a binary-weighted capacitor array for one example implementation. The truth table 500 comprises columns 502–510 and rows 512–520. Row 512 is a header row that identifies each column. Columns 502 and 504 include 2-bit variables $b_1$ and $b_0$, respectively. For a 2-bit system, $b_1$ and $b_0$, there are $2^2$ or 4 combinations, including 0,0 for row 514, 0,1 for row 516, 1,0 for row 518, and 1,1 for row 520. A binary weighting, represented by $C_{bin}$ of column 506, is implemented for the capacitor array (e.g., switched capacitors 404 and 406), wherein $b_1$ is equal to 2C and $b_0$ is equal to C. Thus, 0,0 of row 514 represents a $C_{bin}$ of $0([(0 \times 2^1 + 0 \times 2^0) \times C] = 0)$, 0,1 of row 516 represents a $C_{bin}$ of $C([(0 \times 2^1 + 1 \times 2^0) \times C] = C)$, 1,0 of row 518 represents a $C_{bin}$ of $2C([(1 \times 2^1 + 0 \times 2^0) \times C] = 2C)$, and 1,1 of row 520 represents a $C_{bin}$ of $3C([(1 \times 2^1 + 1 \times 2^0) \times C] = 3C)$.

Columns 508 and 510 represent the variable capacitor (e.g., variable capacitor 402 of FIG. 4B) capacitance values, $C_{var,0.3}$ and $C_{var,2.2}$, respectively. $C_{var,0.3}$ and $C_{var,2.2}$ are the variable capacitor capacitance values at 0.3V and 2.2V. These particular voltages are chosen based on the designed-range of operation for one embodiment of the charge pump 207 (FIG. 4A). It will be understood by one having ordinary skill in the art that other values for the charge pump operating voltage range can be selected.

Using Equation 10 and the truth table 500, the $K_v$ can be calculated for each bit setting:

$$K_{V_{00}} \alpha \frac{1}{\sqrt{C_{2.2}}} - \frac{1}{\sqrt{C_{0.3}}} \quad \text{(Eq. 11)}$$

$$K_{V_{01}} \alpha \frac{1}{\sqrt{C + C_{2.2}}} - \frac{1}{\sqrt{C + C_{0.3}}} \quad \text{(Eq. 12)}$$

-continued $$K_{V_{10}} \alpha \frac{1}{\sqrt{2C+C_{2.2}}} - \frac{1}{\sqrt{2C+C_{0.3}}} \quad \text{(Eq. 13)}$$

$$K_{V_{11}} \alpha \frac{1}{\sqrt{3C+C_{2.2}}} - \frac{1}{\sqrt{3C+C_{0.3}}} \quad \text{(Eq. 14)}$$

Figure 6:
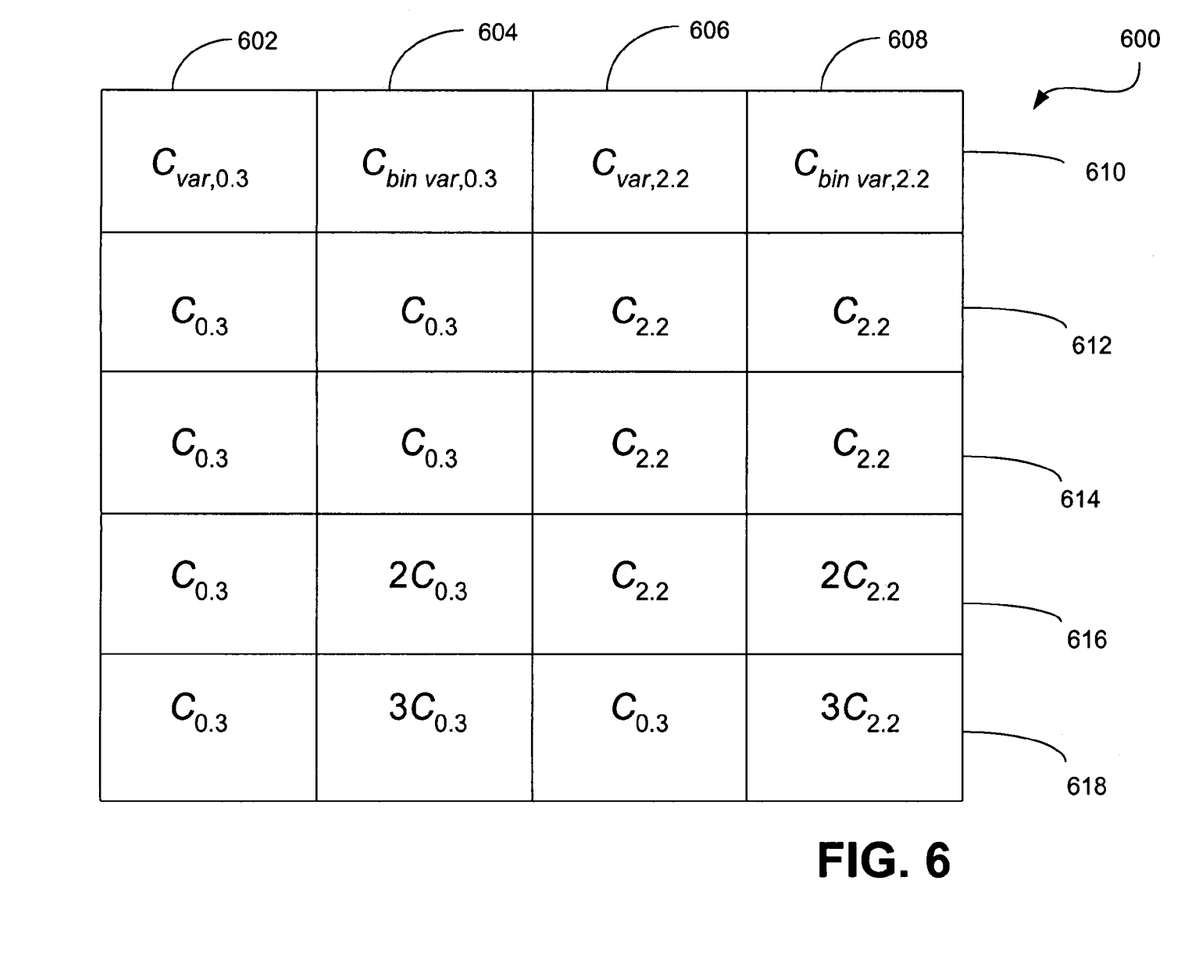
FIG. 6 is a schematic diagram illustrating a binary weighting methodology for the values selected in the truth table of FIG. 5.

The goal of this methodology is to equate the equations (i.e., Eq. 11=Eq. 12=Eq. 13=Eq. 14), since equating them corresponds to maintaining a constant K, versus frequency. FIG. 6 is a schematic diagram of a truth table 600 that is used to illustrate the binary weighting of the variable capacitor. Truth table 600 includes columns 602–608, and rows 610–618. Row 610 identifies the columns 602–608. Columns 602 and 606 are the variable capacitor capacitance values corresponding to the charge pump high and low operating voltages, as described above. Columns 604 and 608 are the binary-weighted capacitor capacitance values at 0.3V and 2.2V. Again, using Eq. 11 and the truth table 600, the $K_v$ can be calculated for each bit setting.

$$K_{V_{00}} \alpha \frac{1}{\sqrt{C_{2.2}}} - \frac{1}{\sqrt{C_{0.3}}} \quad \text{(Eq. 15)}$$

$$K_{V_{01}} \alpha \frac{1}{\sqrt{C+C_{2.2}}} - \frac{1}{\sqrt{C+C_{0.3}}} \propto \quad \text{(Eq. 16)}$$

$$\frac{1}{\sqrt{C}} \left( \frac{1}{\sqrt{1+C_{2.2}/C}} - \frac{1}{\sqrt{1+C_{0.3}/C}} \right)$$

$$K_{V_{10}} \alpha \frac{1}{\sqrt{2C+2C_{2.2}}} - \frac{1}{\sqrt{2C+2C_{0.3}}} \propto \quad \text{(Eq. 17)}$$

$$\frac{1}{\sqrt{2}\sqrt{C}} \left( \frac{1}{\sqrt{1+C_{2.2}/C}} - \frac{1}{\sqrt{1+C_{0.3}/C}} \right)$$

$$K_{V_{11}} \alpha \frac{1}{\sqrt{3C+3C_{2.2}}} - \frac{1}{\sqrt{3C+3C_{0.3}}} \propto \quad \text{(Eq. 18)}$$

$$\frac{1}{\sqrt{3}\sqrt{C}} \left( \frac{1}{\sqrt{1+C_{2.2}/C}} - \frac{1}{\sqrt{1+C_{0.3}/C}} \right)$$

A close examination of equations 16–18 shows that the expressions within the parenthesis are all identical. The only difference in each of these equations is the multiplier on the outside of the parenthesis. Since $$\frac{1}{\sqrt{C}}$$

is also common to each of these equations, the only difference is the $$\frac{1}{\sqrt{Y}},$$

where Y is the state (e.g., 01=1, 10=2, 11=3). From these equations, the observation is made that the $K_v$ varies as $$\frac{1}{\sqrt{\text{State}}}.$$

Since the digital coarse tune (e.g., from frequency control circuit 208, FIG. 4A) provides information about the state, to maintain a $K_v$ that will not vary with frequency, the control voltage is multiplied by $\sqrt{\text{State}}$.

The methodology to implement the 2-bit system can be extended to an n-bit system using the following equation:

$$K_{V_n} \alpha \frac{1}{\sqrt{n}\sqrt{C}} \left( \frac{1}{\sqrt{1+C_{2.2}/C}} - \frac{1}{\sqrt{1+C_{0.3}/C}} \right) \quad \text{(Eq. 19)}$$

Applying Eq. 19 to Eq. 10 provides for a definition of an n-bit, predictable $K_v$ system:

$$k_{V_n} = \frac{1}{2\pi \Delta V \sqrt{n} \sqrt{LC}} \left( \frac{1}{\sqrt{1+C_{2.2}/C}} - \frac{1}{\sqrt{1+C_{0.3}/C}} \right) \quad \text{(Eq. 20)}$$

Multiplying $\Delta V$ by $\frac{1}{\sqrt{n}}$ reduces Eq. 20 to:

$$K_{V_n} = \frac{1}{2\pi \Delta V \sqrt{LC}} \left( \frac{1}{\sqrt{1+C_{2.2}/C}} - \frac{1}{\sqrt{1+C_{0.3}/C}} \right) \quad \text{(Eq. 21)}$$

The $K_v$ now is constant, despite variations in frequency. Thus, in operation, the control voltage derived from the PFD 206 (FIG. 4A) is multiplied by the square root of the state (via the square-root-module 460, FIG. 4A). For example, when the state is 0,1 (=1), the multiplication is by 1 (i.e., sqrt (1)=1). When the state is 1,0 (=2), the multiplication is by 1.414 (i.e., sqrt (2)=1.414).

Note that although binary weighting is described herein, it would be understood in the context of this disclosure by one having ordinary skill in the art that non-binary weighting can be implemented. For example, with adjustment to the algorithms of the PLL, a radix less than two can be used such that there is an overlap between the bits.

Figure 7:
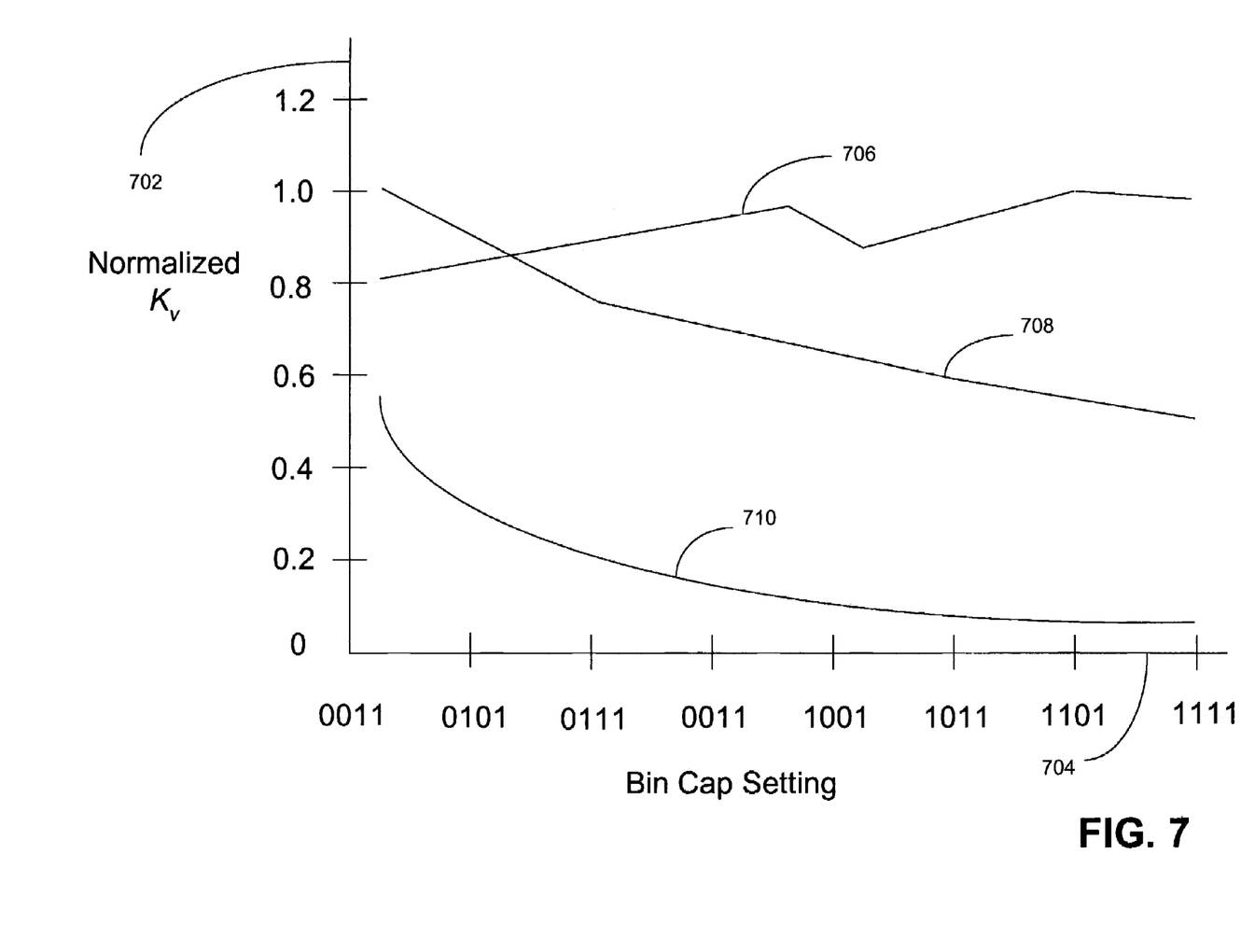
FIG. 7 is a graph illustrating a simulated variation in normalized $K_v$ for the PLL embodiment of FIG. 4A versus $K_v$s for PLLs of various configurations.

FIG. 7 is a graph that illustrates simulated results corresponding to the $K_v$ variation for three different cases. The y-axis 702 represents the normalized $K_v$, and the x-axis 704 represents the binary capacitor capacitance settings. Curve 706 represents the simulated $K_v$ variation for a PLL, such as PLL 101b (FIG. 4A), operating with a binary weighted variable capacitor and a square root module. Curve 708 represents the simulated $K_v$ variation for a PLL operating with a binary weighted variable capacitor (no square root module). Curve 710 represents the simulated K, variation for a PLL operating with a conventional variable capacitor (no binary weighting and no square root module). As shown, the $K_v$ using the conventional approach (curve 710) varies as much as 82.7% versus frequency. The $K_v$ using the binary-weighted variable capacitor (curve 708) varies as much as 47.1%. The $K_v$ using the binary weighted variable capacitor and the square root module (curve 706) of a PLL according to an embodiment of the invention varies approximately 18%. Further, experimental results show that using a binary-weighted variable capacitor broadens the tuning range (1.576–4.11 giga-Hertz (GHz)), compared to 1.155–2.776 GHz using conventional methods.

The PLL 101 (e.g., PLL 101a of FIG. 3A and PLL 101b of FIG. 4A) can be implemented in software, hardware, or a combination of software and hardware. In a preferred embodiment, the PLL 101 may be implemented in hardware. The hardware of the invention can be implemented using specialized hardware elements and logic. If portions are implemented in software, the software portion can be stored in a memory and be executed by a suitable instruction execution system (microprocessor). The hardware implementation of the PLL 101 can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

The software of the PLL 101 comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

While various embodiments of the invention have been described, it will be apparent to those of ordinary skill in the art that many more embodiments and implementations are possible that are within the scope of this invention. Accordingly, the invention is not to be restricted except in light of the following claims and their equivalents.

What is claimed is:

1. A method for operating a phase-locked loop (PLL), said method comprising:
    providing a control current; and
    varying the control current in proportion to the inverse of N squared, wherein N is a ratio of an output frequency of the PLL to a reference frequency of the PLL, wherein varying the control current compensates for bandwidth changes of the PLL.

2. The method of claim 1, wherein varying includes varying a magnitude of the control current.

3. The method of claim 1, wherein varying includes altering current flow provided by at least one current source, wherein the at least one current source provides the control current.

4. The method of claim 3, wherein the at least one current source is disposed in a charge pump, the charge pump disposed in the PLL.

5. The method of claim 3, further including receiving a value of N, wherein the altering is based on the value of N.

6. A method for operating a phase-locked loop (PLL), said method comprising:
    providing a detector; and
    varying the gain of the detector in proportion to the inverse of N squared, wherein N is a ratio of an output frequency of the PLL to a reference frequency of the PLL, wherein varying the gain of the detector compensates for bandwidth changes of the PLL.

7. The method of claim 6, wherein the detector includes at least one of a phase detector and a frequency detector.

8. A phase-locked loop (PLL), comprising:
    a current generating device configured to generate a control current; and
    a switching module configured to vary the control current in proportion to the inverse of N squared, wherein N is a ratio of an output frequency of the PLL to a reference frequency of the PLL.

9. The phase-locked loop of claim 8, wherein the current generating device includes at least one current source and at least one switch that controls the flow through the at least one current source.

10. The phase-locked loop of claim 9, wherein the switching module is configured to activate the at least one switch based on a value of N programmed into the PLL.

11. The phase-locked loop of claim 9, wherein the switching module is configured to activate the at least one switch based on a threshold range of N.

12. The phase-locked loop of claim 8, wherein the current generating device is a charge pump.

13. The phase-locked loop of claim 12, further including a loop filter, an oscillator, a divide-by-N module, and a phase/frequency detection device, wherein the loop filter is disposed between the charge pump and the oscillator, the divide-by-N module is disposed between the oscillator and the phase/frequency device, the phase/frequency device is coupled to the charge pump.

14. The phase-locked loop of claim 13, wherein the charge pump, the loop filter, the oscillator, the divide-by-N module, and the phase/frequency detection device are disposed on a single semiconductor chip.

15. A phase-locked loop (PLL), comprising:
    a detector; and
    a switching module configured to vary the gain of the detector in proportion to the inverse of N squared, wherein N is a ratio of an output frequency of the PLL to a reference frequency of the PLL.

16. The phase-locked loop of claim 15, wherein the detector includes one of a phase detector and a frequency detector.

17. The phase-locked loop of claim 16, further including a loop filter, an oscillator, and a divide-by-N module, the loop filter disposed between the detector and the oscillator, the divide-by-N module disposed between the oscillator and the detector.

18. The phase-locked loop of claim 17, wherein the loop filter, the oscillator, the divide-by-N module, and the detector are disposed on a single semiconductor chip.

* * * * *

UNITED STATES PATENT AND TRADEMARK OFFICE
CERTIFICATE OF CORRECTION

PATENT NO. : 7,138,839 B2 Page 1 of 1
APPLICATION NO. : 10/849266
DATED : November 21, 2006
INVENTOR(S) : Zachan et al.

It is certified that error appears in the above-identified patent and that said Letters Patent is hereby corrected as shown below:

Title Page

Item (75): Please delete the following inventors:

"Jeffrey M. Zachan, Aliso Viego, CA (US)"
"Geoff Hatcher, Newport Beach, CA (US)"

Signed and Sealed this

Eighteenth Day of September, 2007

JON W. DUDAS
*Director of the United States Patent and Trademark Office*